(12) United States Patent
Okada

(10) Patent No.: US 12,224,731 B2
(45) Date of Patent: Feb. 11, 2025

(54) NOISE FILTER

(71) Applicant: KITAGAWA INDUSTRIES CO., LTD., Aichi (JP)

(72) Inventor: Yuya Okada, Aichi (JP)

(73) Assignee: KITAGAWA INDUSTRIES CO., LTD., Aichi (JP)

( * ) Notice: Subject to any disclaimer, the term of this patent is extended or adjusted under 35 U.S.C. 154(b) by 225 days.

(21) Appl. No.: 18/017,364

(22) PCT Filed: Jul. 15, 2021

(86) PCT No.: PCT/JP2021/026596
§ 371 (c)(1),
(2) Date: Jan. 20, 2023

(87) PCT Pub. No.: WO2022/019206
PCT Pub. Date: Jan. 27, 2022

(65) Prior Publication Data
US 2023/0261627 A1   Aug. 17, 2023

(30) Foreign Application Priority Data

Jul. 21, 2020   (JP) ................. 2020-124449

(51) Int. Cl.
*H03H 7/09* (2006.01)
*H01F 17/06* (2006.01)

(52) U.S. Cl.
CPC ............... *H03H 7/09* (2013.01); *H01F 17/06* (2013.01); *H01F 2017/065* (2013.01)

(58) Field of Classification Search
CPC .. H01F 17/06; H01F 2017/065; H01F 27/266; H01F 27/02; H01F 3/10;

(Continued)

(56) References Cited

U.S. PATENT DOCUMENTS

2017/0012592 A1\* 1/2017 Tanimizu ................ H01F 27/02

FOREIGN PATENT DOCUMENTS

JP   H0383911 U   8/1991
JP   H0561972 U   8/1993

(Continued)

OTHER PUBLICATIONS

International Search Report, dated Sep. 7, 2021, received in connection with corresponding International Patent Application No. PCT/JP2021/026596.

(Continued)

*Primary Examiner* — Lincoln D Donovan
*Assistant Examiner* — Tyler J Pereny
(74) *Attorney, Agent, or Firm* — Meunier Carlin & Curfman LLC

(57) ABSTRACT

There is provided a noise filter. A noise filter according to the present disclosure includes: a non-divided type magnetic core in which a through-hole having a first opening and a second opening at respective ends of the through-hole is formed; a conductive coupling terminal including a first connection portion and a second connection portion at respective ends of the conductive coupling terminal, the first connection portion and the second connection portion being connectable to busbars, the conductive coupling terminal being disposed inside the through-hole; and a holding portion that holds the coupling terminal disposed inside the through-hole. The coupling terminal is held to the magnetic core by the holding portion in a state where the first connection portion faces the first opening from inside of the through-hole and the second connection portion faces the second opening from inside of the through-hole.

6 Claims, 14 Drawing Sheets

(58) Field of Classification Search
CPC ....... H01F 17/04; H01F 27/24; H03H 1/0007; H03H 2001/0035; H03H 2001/0057; H03H 2001/005; H03H 7/0115; H03H 7/09
See application file for complete search history.

(56) References Cited

FOREIGN PATENT DOCUMENTS

JP         H0629127 A     2/1994
JP       2019186406 A    10/2019

OTHER PUBLICATIONS

IPRP & Written Opinion of the International Searching Authority, dated Jan. 24, 2023, received in connection with corresponding International Patent Application No. PCT/JP2021/026596.

\* cited by examiner

NOISE FILTER

CROSS-REFERENCE TO RELATED APPLICATIONS

This application is a United States National Phase Patent Application of international application number PCT/JP2021/026596, filed on Jul. 15, 2021, which claims the benefit of priority to Japanese Patent Application No. 2020-124449, filed with the Japan Patent Office on Jul. 21, 2020, the entire contents of which are incorporated herein by reference.

TECHNICAL FIELD

The present disclosure relates to a noise filter that reduces noise radiated from a busbar.

BACKGROUND ART

Patent Document 1 describes a noise filter as a measure against noise radiated from a conductive busbar. The noise filter includes a magnetic core having a through-hole, and is used by passing the busbar through the through-hole of the magnetic core.

CITATION LIST

Patent Literature

Patent Document 1: Japanese Unexamined Patent Application Publication No. 2019-186406

SUMMARY OF INVENTION

Technical Problem

A bent-shaped busbar may be used in consideration of routing of the busbar in a device. When the bent-shaped busbar is attempted to be inserted into the through-hole of the magnetic core, the bent portion in the busbar interferes with an opening edge portion of the through-hole, and the busbar cannot pass through the through-hole in some cases. In such a case, for example, it is considered that a configuration in which an inner diameter dimension of the through-hole of the magnetic core is increased or a configuration in which the magnetic core has a divided structure is employed to cause the bent-shaped busbar to pass through the through-hole of the magnetic core. However, the larger the inner diameter dimension of the through-hole is, the lower an impedance of the magnetic core becomes, and therefore a noise reduction effect of the noise filter decreases. With the magnetic core having the divided structure, a magnetic permeability of the magnetic core decreases, thus reducing the noise reduction effect of the noise filter.

The present disclosure preferably provides a noise filter that is less likely to reduce a noise reduction effect while increasing a degree of freedom in a busbar shape in a device.

Solution to Problem

A noise filter according to an aspect of the present disclosure includes a non-divided type magnetic core, a conductive coupling terminal, and a holding portion. In the non-divided type magnetic core, a through-hole having a first opening and a second opening at respective ends of the through-hole is formed. The conductive coupling terminal includes a first connection portion and a second connection portion at respective ends of the conductive coupling terminal. The first connection portion and the second connection portion are connectable to busbars. The conductive coupling terminal is disposed inside the through-hole. The holding portion holds the coupling terminal disposed inside the through-hole. The coupling terminal is held to the magnetic core by the holding portion in a state where the first connection portion faces the first opening from inside of the through-hole and the second connection portion faces the second opening from inside of the through-hole.

In the configuration described above, the conductive coupling terminal having the first connection portion and the second connection portion connectable to the busbars at respective ends is disposed in the through-hole integrally formed with the magnetic core. The coupling terminal is held to the inside of the through-hole by the holding portion in the state where the first connection portion faces the first opening from inside of the through-hole and the second connection portion faces the second opening from inside of the through-hole in an extending direction of the through-hole. As a result, among a set of the busbars, a first busbar is connected to the first connection portion through the first opening of the through-hole and a second busbar is connected to the second connection portion through the second opening of the through-hole, and thus both busbars can be coupled. Therefore, even when the non-divided type magnetic core is used, a signal flowing through the first busbar can be passed through the through-hole of the magnetic core and flow to the second busbar regardless of a bent shape of the busbar. As a result, the noise filter can be less likely to reduce a noise reduction effect while increasing a degree of freedom in the busbar shape in a device.

The noise filter according to an aspect of the present disclosure may include a case made of a non-conductive resin and housing the magnetic core. The case may include a through-portion having a tubular shape. The case may house the magnetic core in a state where the through-portion passes through the through-hole. The coupling terminal may be disposed inside the through-portion.

In the noise filter according to an aspect of the present disclosure, the holding portion may include a housing portion disposed inside the through-hole. The housing portion may house the coupling terminal to hold the coupling terminal. This allows the coupling terminal to be held in the through-hole while the coupling terminal maintains insulation properties with the magnetic core. Thus, while a signal is appropriately transmitted between the busbars, the noise reduction effect of the noise filter can be less likely to be reduced.

In the noise filter according to an aspect of the present disclosure, the holding portion may include a locking portion. The locking portion may be disposed inside the through-hole to lock the holding portion to the magnetic core. This enhances a fixing force of the holding portion with respect to the magnetic core to ensure that the coupling terminal is reliably positioned in the through-hole of the magnetic core. For example, even when an external force is applied to the coupling terminal via the busbar, it can be suppressed that the coupling terminal is pulled out of the through-hole of the magnetic core, and reduction in noise reduction effect of the noise filter can be suppressed.

One aspect of the present disclosure may include a case made of a non-conductive resin and housing the magnetic core. The holding portion may be disposed inside the through-hole and integrally formed with the case. As a result, in the noise filter provided with the case, an increase in the number of components can be suppressed while effects of the present disclosure are provided.

Advantageous Effects of Invention

The present disclosure can provide the noise filter that is less likely to reduce a noise reduction effect of the noise filter while increasing a degree of freedom in a busbar shape in a device.

REFERENCE SIGNS LIST

Figure 1:
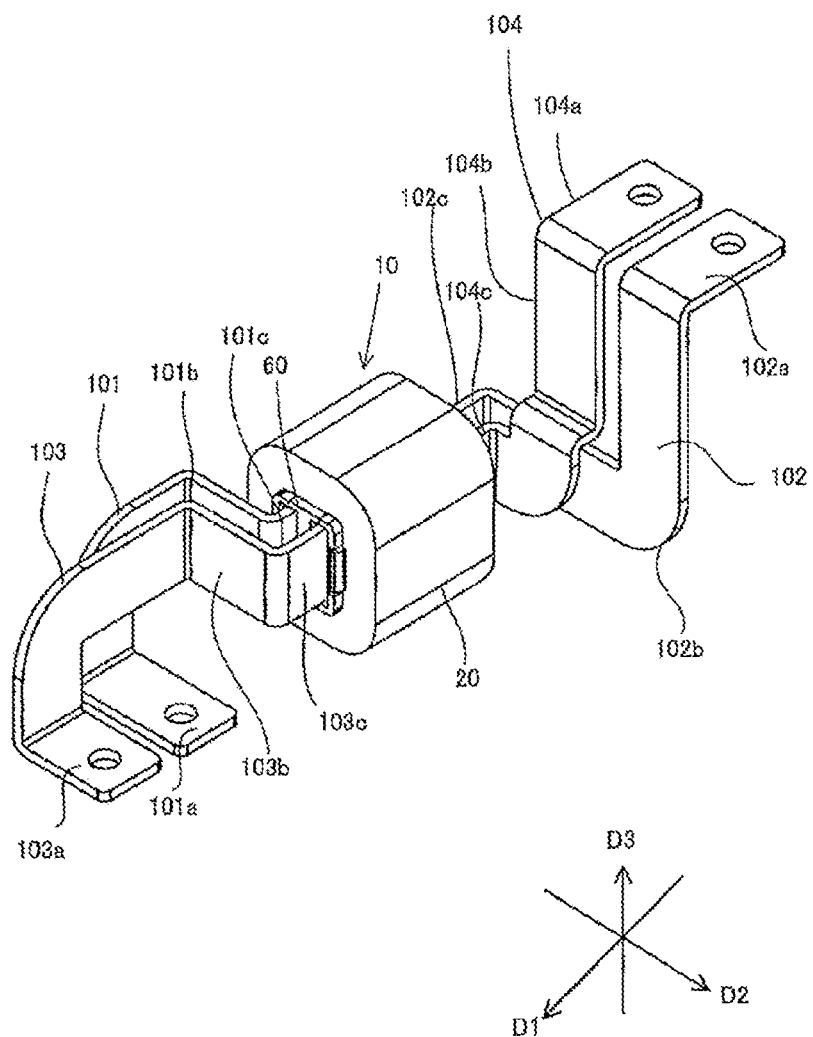
FIG. 1 is a perspective view of a noise filter.

10 . . . Noise filter
20 . . . Magnetic core
40, 50 . . . Coupling terminal
41 . . . First connection portion
42 . . . Second connection portion
60 . . . Holding portion
101, 102, 103, 104 . . . Busbar
613, 614, 615, 616 . . . Opening

DESCRIPTION OF EMBODIMENTS

The following will describe embodiments of a noise filter with reference to the drawings. Note that, in the following description, respective directions illustrated in the drawings are used for explanation as needed. Specifically, a direction in which a through-hole of a magnetic core extends is a first direction, and respective directions orthogonal to the first direction is referred to as a second direction and a third direction. However, these respective directions are defined only for the purpose of facilitating descriptions of relative positional relationship of respective portions constituting the noise filter. To actually use the noise filter, the noise filter may be oriented in any direction. For example, the noise filter may be used in a state where the third direction illustrated in the drawing does not match the vertical direction due to the relationship of the third direction with gravity.

1. First Embodiment 1-1. Configuration

Figure 2:
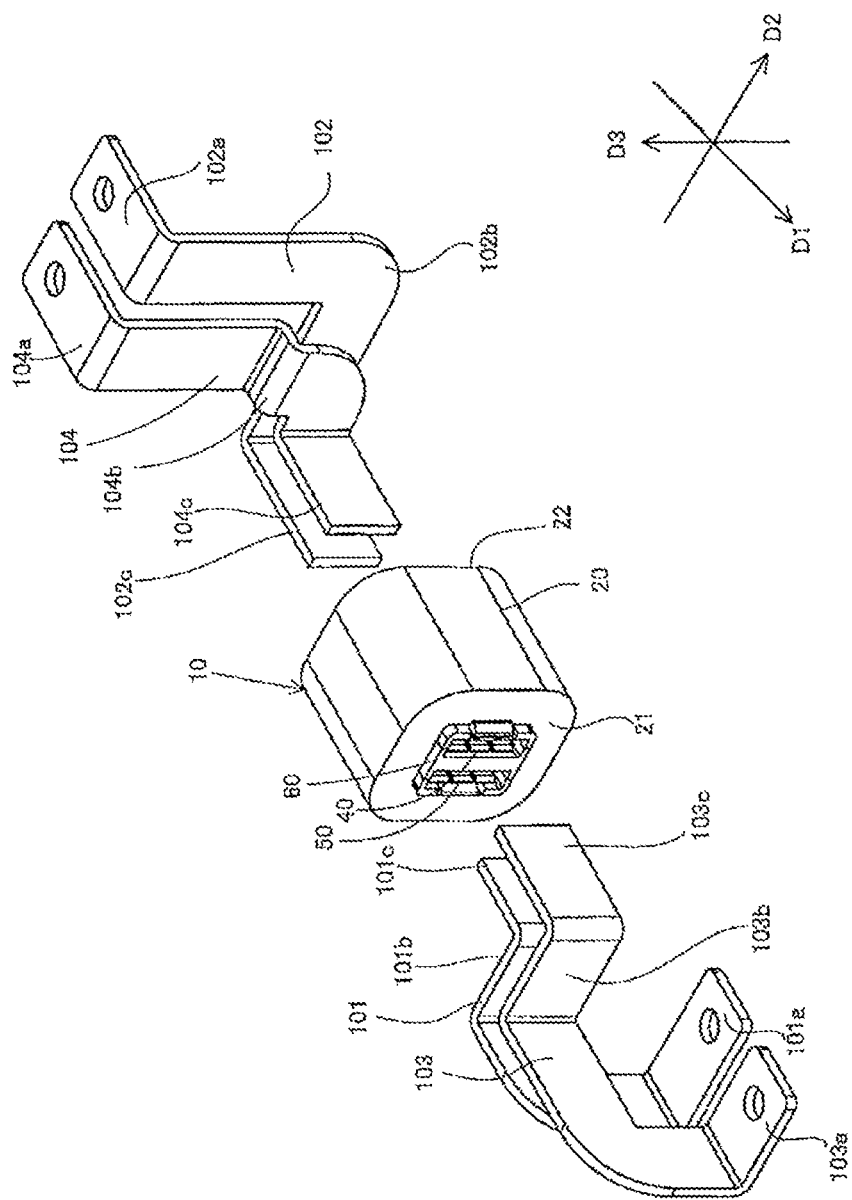
FIG. 2 is a perspective view of the noise filter.

A noise filter 10 illustrated in FIGS. 1 and 2 is a device connected to busbars 101, 102, 103, and 104 to reduce radiation of noises from the busbars 101 to 104. Specifically, the noise filter 10 couples a set of the busbars 101 and 102, and relays a signal flowing from a circuit (not illustrated) to the busbar 101 to the busbar 102 while causing the signal to pass through a through-hole of a magnetic core 20. The noise filter 10 couples a set of the busbars 103 and 104, and relays a signal flowing from the circuit (not illustrated) to the busbar 103 to the busbar 104 while causing the signal to pass through the through-hole of the magnetic core 20.

In the present embodiment, each of the busbars 101 to 104 has bent flat plate pieces to form an attachment seat portion, an extension portion, and an insertion portion. Attachment seat portions 101*a*, 102*a*, 103*a*, and 104*a* are portions each having a through-hole. Terminal fixing bolts pass through the through-holes for fixing the busbars 101 to 104 to a device. In the present embodiment, each of the attachment seat portions 101*a* to 104*a* has a surface parallel to a plane defined in a first direction D1 and a second direction D2. Extension portions 101*b*, 102*b*, 103*b*, and 104*b* are portions that connect the attachment seat portions 101*a* to 104*a* and insertion portions 101*c* to 104*c* of the busbars 101 to 104, respectively. In the present embodiment, the extension portions 101*b* to 104*b* are portions bent in specified directions with respect to the attachment seat portions 101*a* to 104*a* and the insertion portions 101*c* to 104*c*. The insertion portions 101*c*, 102*c*, 103*c*, and 104*c* are portions connected to coupling terminals 40 and 50 included in the noise filter 10.

Figure 3:
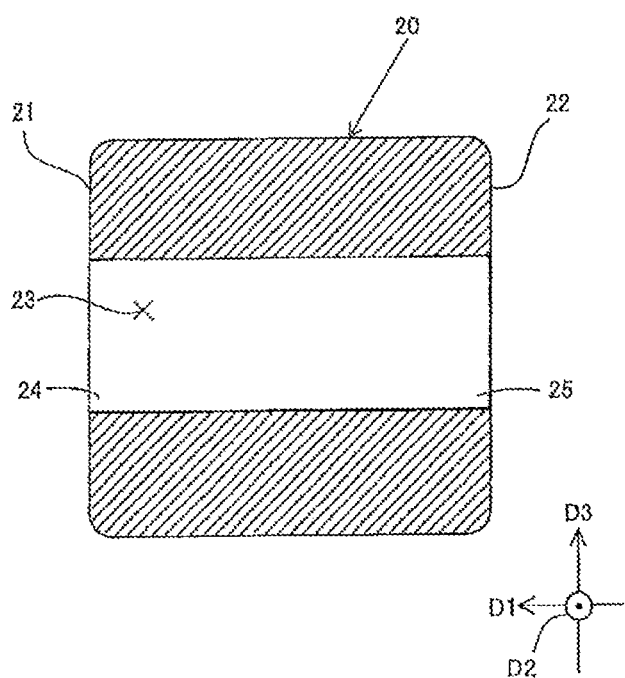
FIG. 3 is a cross-sectional view of a magnetic core.

In addition to the magnetic core 20 described above, the noise filter 10 includes the coupling terminals 40 and 50 and a holding portion 60. FIG. 3 is a cross-sectional view of the magnetic core 20 in a surface along the first direction D1. The magnetic core 20 is a ring-shaped non-divided type magnetic core having end surfaces 21 and 22. A through-hole 23 is formed in the magnetic core 20. The through-hole 23 is a through-hole extending from an opening 24 formed in the first end surface 21 of the magnetic core 20 to an opening 25 formed in the second end surface 22. For the magnetic core 20, for example, a soft ferrite as a soft magnetic material or a nanocrystalline soft magnetic material mainly containing a fine metal can be used. As the nanocrystalline soft magnetic material, for example, FINEMET (registered trademark) can be used.

Figure 4:
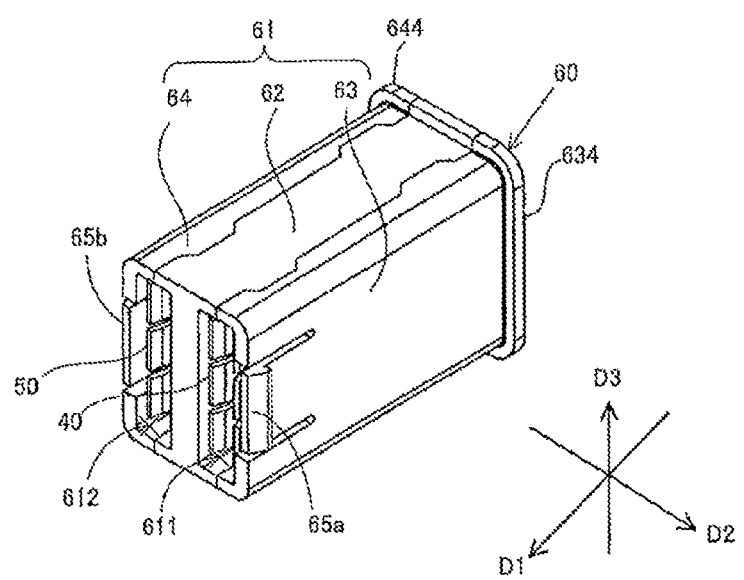
FIG. 4 is a perspective view of a holding portion.
Figure 5:
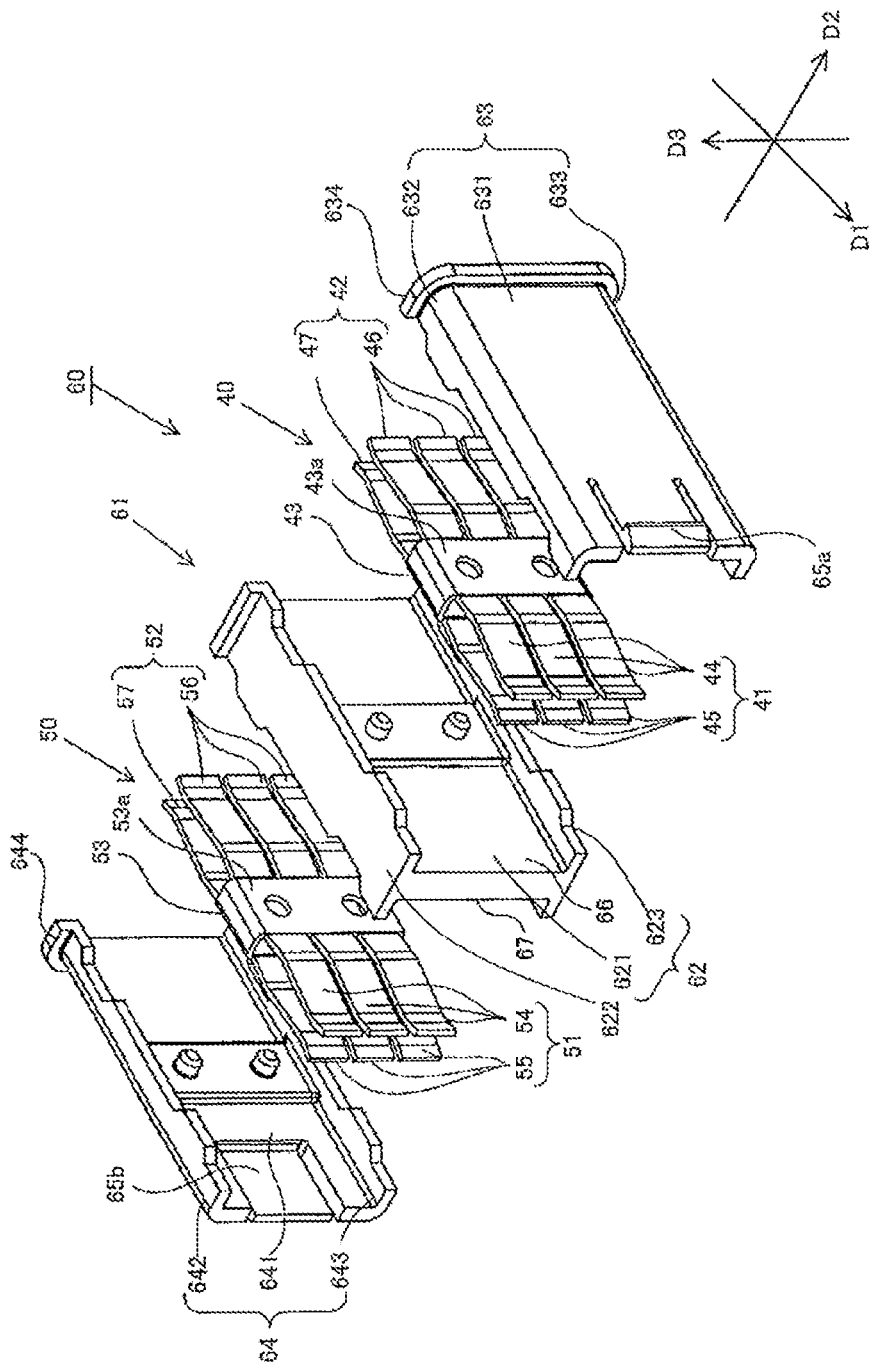
FIG. 5 is an exploded view of the holding portion.
Figure 6:
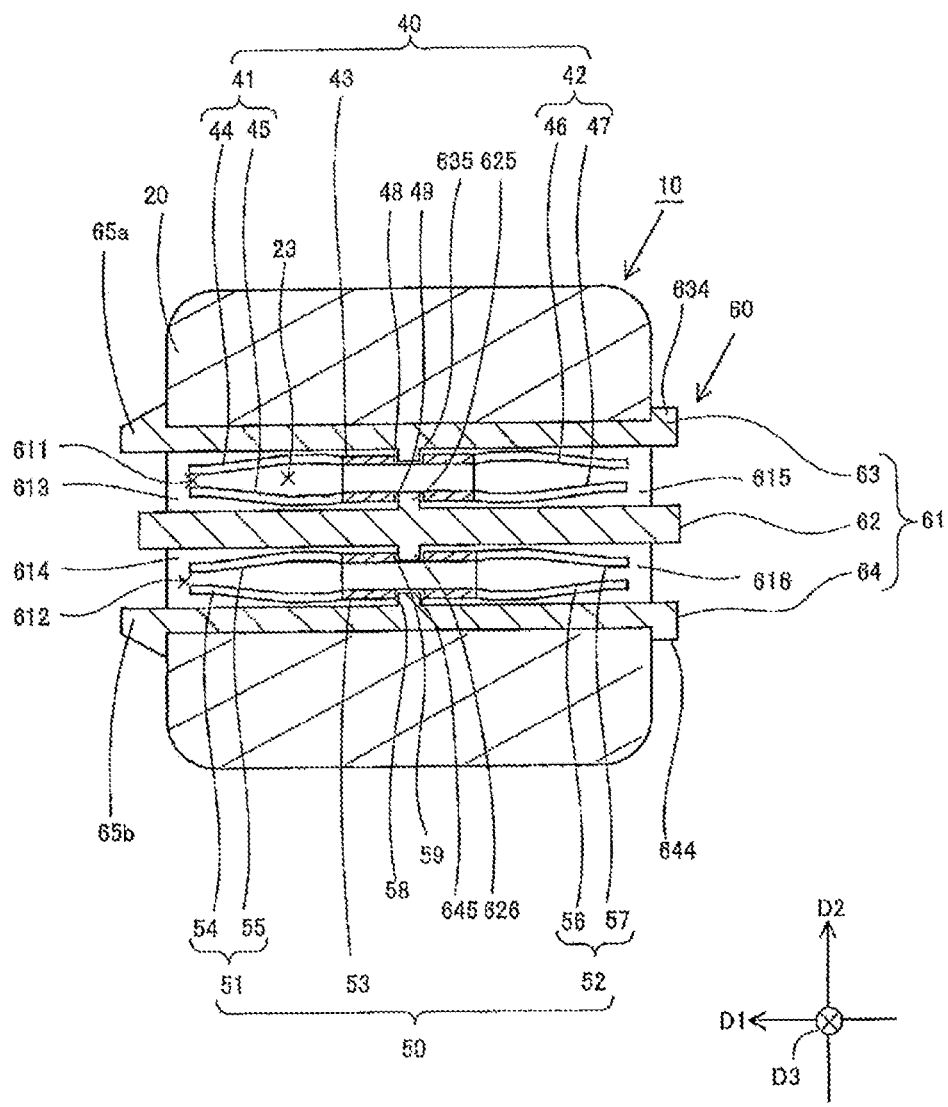
FIG. 6 is a cross-sectional view of the noise filter in a surface parallel to a first direction and a second direction.

Next, the configuration of the holding portion 60 will be described. As illustrated in FIGS. 4, 5, and 6, the holding portion 60 is a member that holds the coupling terminals 40 and 50 inside the through-hole 23 of the magnetic core 20. The holding portion 60 includes a housing portion 61 that houses the coupling terminals 40 and 50 and a set of locking portions 65*a* and 65*b*.

The housing portion 61 is a container that houses the coupling terminals 40 and 50 in a state of being arranged along the second direction D2. Specifically, a housing space 611 that houses the coupling terminal 40 and a housing space 612 that houses the coupling terminal 50 are formed inside the housing portion 61. As illustrated in FIG. 6, the housing space 611 extends in the housing portion 61 from an opening 613 formed at a first end portion in the first direction D1 to an opening 615 formed at a second end portion in the first direction D1. As illustrated in FIG. 6, the housing space 612 extends in the housing portion 61 from an opening 614 formed at the first end portion in the first direction D1 to an opening 616 formed at the second end portion in the first direction D1.

Figure 7:
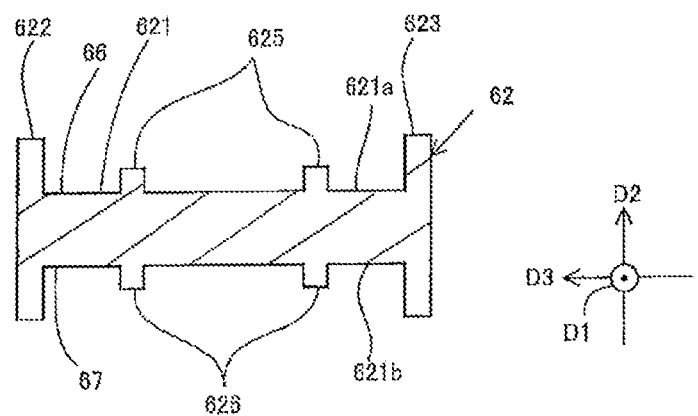
FIG. 7 is a cross-sectional view of a container body in a surface parallel to the second direction and a third direction.
Figure 8:
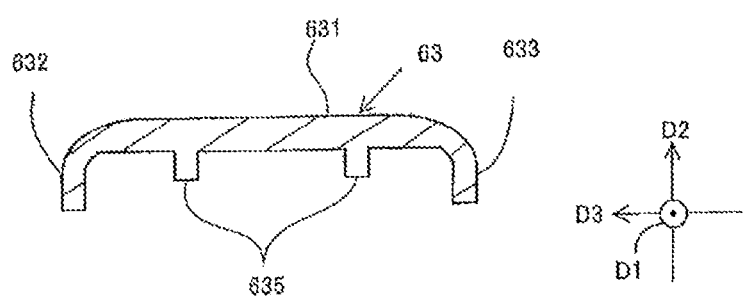
FIG. 8 is a cross-sectional view of a first lid portion in the surface parallel to the second direction and the third direction.
Figure 9:
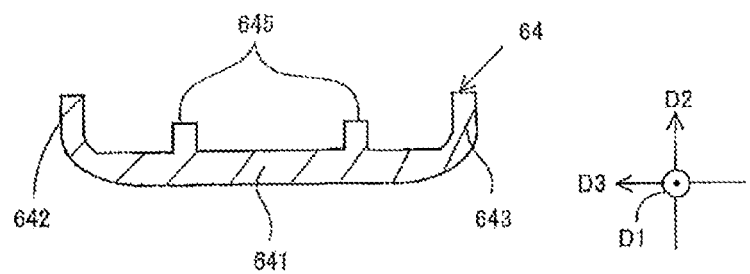
FIG. 9 is a cross-sectional view of a second lid portion in the surface parallel to the second direction and the third direction.

In the present embodiment, the housing portion 61 includes a container body 62, a first lid portion 63, and a second lid portion 64. The housing portion 61 is configured by assembling the container body 62, the first lid portion 63, and the second lid portion 64. FIG. 7 is a cross-sectional view of the container body 62 in a surface parallel to the second direction D2 and a third direction D3. FIG. 8 is a cross-sectional view of the first lid portion 63 in the surface parallel to the second direction D2 and the third direction D3. FIG. 9 is a cross-sectional view of the second lid portion 64 in the surface parallel to the second direction D2 and the third direction D3.

As illustrated in FIG. 5, the container body 62 has a partition wall portion 621, which is a rectangular wall, and side wall portions 622 and 623 provided at respective ends in the third direction D3 of the partition wall portion 621. Specifically, the side wall portions 622 and 623 extend in the second direction D2 from respective ends in the third direction D3 of the partition wall portion 621, and have substantially H-shaped cross-sectional surfaces in planes defined in the second direction D2 and the third direction D3. In other words, as illustrated in FIG. 7, a first recessed portion 66 having a first surface in the third direction D3 of the partition wall portion 621 as a bottom surface 621*a* is formed in the container body 62. Additionally, a second recessed portion 67 having a second surface in the third direction D3 of the partition wall portion 621 as a bottom surface 621*b* is formed in the container body 62. Holding protrusions 625 protruding in the second direction D2 are provided on the bottom surface 621*a* of the partition wall portion 621, and holding protrusions 626 protruding in the second direction D2 are provided on the bottom surface 621*b* of the partition wall portion 621. The container body 62 is non-conductive and made of, for example, a polyamide resin.

As illustrated in FIG. 8, the first lid portion 63 has a rectangular base portion 631 and side wall portions 632 and 633 extending from respective ends in the third direction D3 of the base portion 631. Holding protrusions 635 protruding in the second direction D2 are provided on the back surface facing the container body 62 of the base portion 631. The first lid portion 63 is non-conductive and made of, for example, a polyamide resin. As illustrated in FIGS. 5 and 6, a flange 634 that protrudes outward from the base portion 631 and the side wall portions 632 and 633 is formed at an end in the first direction D1 of the first lid portion 63.

As illustrated in FIG. 9, the second lid portion 64 has a rectangular base portion 641 and side wall portions 642 and 643 extending from respective ends in the third direction D3 of the base portion 641. Holding protrusions 645 protruding in the second direction D2 are provided on the back surface, which is a surface facing the container body 62, of the base portion 641. As illustrated in FIGS. 5 and 6, a flange 644 that protrudes outward from the base portion 641 and the side wall portions 642 and 643 is formed at an end in the first direction D1 of the second lid portion 64. The second lid portion 64 is non-conductive and made of, for example, a polyamide resin.

As illustrated in FIGS. 4 and 5, the locking portion 65*a* is formed at an end portion in the first direction D1 of the first lid portion 63. Additionally, the locking portion 65*b* is formed at an end portion in the first direction D1 of the second lid portion 64. Specifically, the locking portions 65*a* and 65*b* are formed at ends on the sides opposite to the ends in the first direction D1 where the flanges 634 and 644 are formed in the first and second lid portions 63 and 64. In the present embodiment, the locking portions 65*a* and 65*b* are formed by notching the edges of the base portions 631 and 641 in the first direction D1, and are configured as claw portions having elasticity in the second direction D2.

Next, the configuration of the coupling terminals 40 and 50 will be described. As illustrated in FIG. 2, the coupling terminals 40 and 50 are terminals that allow coupling the busbars 101 to 104 by inserting the insertion portions 101*c* to 104*c* of the respective busbars 101 to 104 into the coupling terminals 40 and 50. The respective insertion portions 101*c* and 102*c* of the busbars 101 and 102 are inserted into the coupling terminal 40, and the respective insertion portions 103*c* and 104*c* of the busbars 103 and 104 are inserted into the coupling terminal 50. The coupling terminals 40 and 50 are formed of conductive members, such as copper, and are particularly preferably materials having elasticity, such as phosphor bronze.

Figure 10:
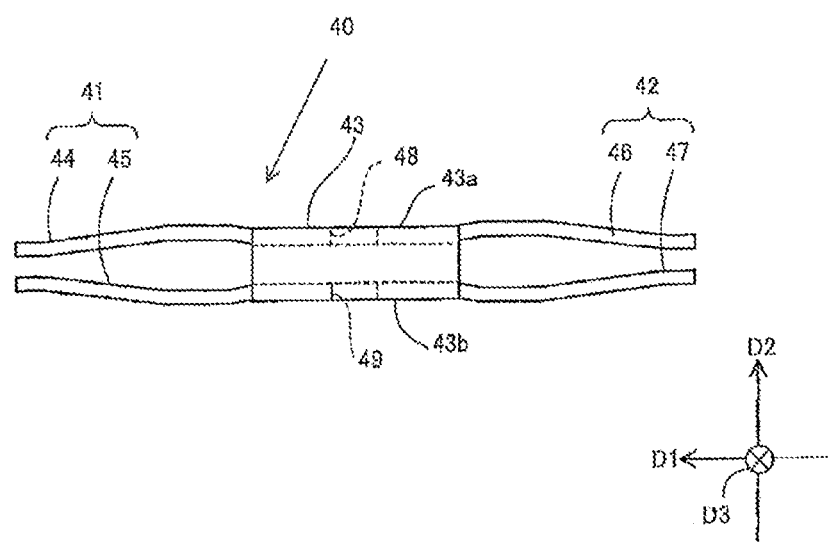
FIG. 10 is a diagram illustrating a coupling terminal.

As illustrated in FIGS. 5 and 10, the coupling terminal 40 includes a first connection portion 41, a second connection portion 42, and a held portion 43. The held portion 43 is a rectangular parallelepiped portion located between the first connection portion 41 and the second connection portion 42 and open in the first direction D1. As illustrated in FIG. 10, the held portion 43 has holding surfaces 43*a* and 43*b* that are surfaces parallel to one another and facing in the second direction D2. Among the holding surfaces 43*a* and 43*b*, holding holes 48 are formed in the holding surface 43*a*, and holding holes 49 are formed in the holding surface 43*b*. Note that, in FIG. 10, the holding holes 48 and 49 are illustrated by broken lines. When the housing portion 61 is assembled, the holding protrusions 635 of the first lid portion 63 are inserted into the holding holes 48, and the holding protrusions 625 of the container body 62 are inserted into the holding holes 49.

As illustrated in FIG. 5, the first connection portion 41 includes three pairs of elastic pieces 44 and 45. As illustrated in FIG. 10, the elastic pieces 44 and 45 extend from a first edge in the first direction D1 of the held portion 43, and grip the busbar 103 in cooperation. Each of the elastic pieces 44 and 45 has a thin plate shape and has elasticity in the direction (namely, the second direction D2) of gripping the busbar 103. The elastic piece 44 extends from the first edge of the holding surface 43*a*, the elastic piece 45 extends from the first edge of the holding surface 43*b*, and the elastic piece 45 and the elastic piece 46 are paired to grip the busbar. In the present embodiment, the three pairs of elastic pieces 44 and 45 are arranged in the third direction D3 from the held portion 43 as the first connection portion 41.

As illustrated in FIG. 5, the second connection portion 42 includes three pairs of elastic pieces 46 and 47. As illustrated in FIG. 10, the elastic pieces 46 and 47 extend from a second edge in the first direction D1 of the held portion 43, and grip the busbar 104 in cooperation. Each of the elastic pieces 46 and 47 has a thin plate shape and has elasticity in the direction (namely, the second direction D2) of gripping the busbar 104. The elastic piece 46 extends from the second edge of the holding surface 43*a*, the elastic piece 47 extends from the second edge of the holding surface 43*b*, and the elastic piece 46 and the elastic piece 47 are paired to grip the busbar. In the present embodiment, the three pairs of elastic pieces 46 and 47 are arranged in the third direction D3 from the held portion 43 as the second connection portion 42.

Figure 11:
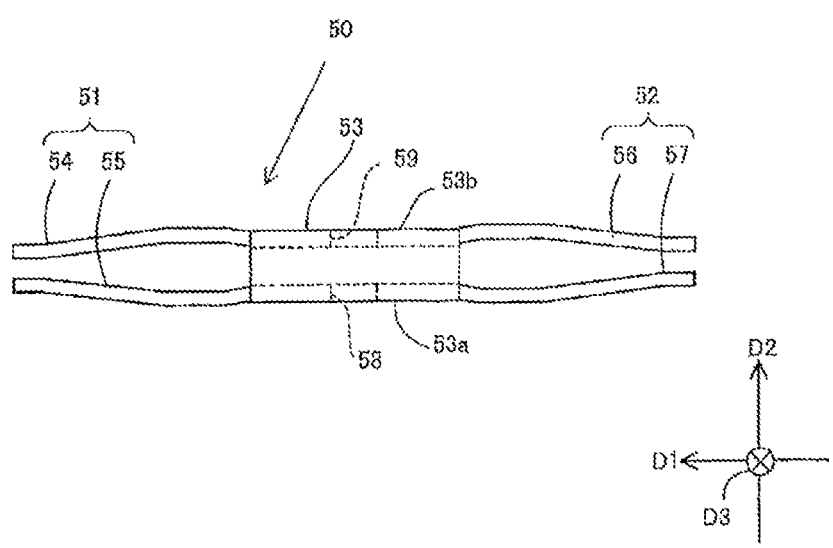
FIG. 11 is a diagram illustrating a coupling terminal.

As illustrated in FIGS. 5 and 11, the coupling terminal 50 includes a first connection portion 51, a second connection portion 52, and a held portion 53. In the present embodiment, the coupling terminal 50 has the same shape as the coupling terminal 40. That is, the held portion 53 is a rectangular parallelepiped portion located between the first connection portion 51 and the second connection portion 52 and open in the first direction D1. As illustrated in FIG. 11, the held portion 53 has holding surfaces 53a and 53b that are surfaces parallel to one another and facing in the second direction D2. Among the holding surfaces 53a and 53b, holding holes 58 are formed in the holding surface 53a, and holding holes 59 are formed in the holding surface 53b. Note that, in FIG. 11, the holding holes 58 and 59 are illustrated by broken lines. When the housing portion 61 is assembled, the holding protrusions 645 of the second lid portion 64 are inserted into the holding holes 58, and the holding protrusions 625 of the container body 62 are inserted into the holding holes 59.

As illustrated in FIG. 5, the first connection portion 51 includes three pairs of elastic pieces 54 and 55. As illustrated in FIG. 11, the elastic pieces 54 and 55 extend from a first edge in the first direction D1 of the held portion 53, and grip the busbar 101 in cooperation. Each of the elastic pieces 54 and 55 has a thin plate shape and has elasticity in the direction (namely, the second direction D2) of gripping the busbar 101. The elastic piece 54 extends from the first edge of the holding surface 53a, the elastic piece 55 extends from the first edge of the holding surface 53b, and the elastic piece 55 and the elastic piece 56 are paired to grip the busbar. In the present embodiment, the three pairs of elastic pieces 54 and 55 are arranged in the third direction D3 from the held portion 53 as the first connection portion 51.

As illustrated in FIG. 5, the second connection portion 52 includes three pairs of elastic pieces 56 and 57. As illustrated in FIG. 11, the elastic pieces 56 and 57 are configured by the elastic pieces 56 and 57 that extend from a second edge in the first direction D1 of the held portion 53, and grip the busbar 102 in cooperation. Each of the elastic pieces 56 and 57 has a thin plate shape and has elasticity in the direction (namely, the second direction D2) of gripping the busbar 102. The elastic piece 56 extends from the second edge of the holding surface 53a, the elastic piece 57 extends from the second edge of the holding surface 53b, and the elastic piece 56 and the elastic piece 57 are paired to grip the busbar. In the present embodiment, the three pairs of elastic pieces 56 and 57 are arranged in the third direction D3 from the held portion 53 as the second connection portion 52.

1-2. Assembly Procedure

Next, a procedure for assembling the noise filter 10 will be described with reference to FIGS. 5 and 6.

First, while the coupling terminal 40 is housed in the first recessed portion 66 of the container body 62, the first lid portion 63 is fitted to an opening side of the first recessed portion 66 of the container body 62. As a result, the housing space 611 in which the coupling terminal 40 is housed is formed by the inner side of the first recessed portion 66 and the back surface of the first lid portion 63. At this time, in the coupling terminal 40, the holding protrusions 625 of the container body 62 are inserted into the holding holes 49 of the held portion 43, and the holding protrusions 635 of the first lid portion 63 are inserted into the holding holes 48 of the held portion 43. As a result, the coupling terminal 40 is held in the housing space 611 of the housing portion 61 with the first connection portion 41 facing the opening 613 and the second connection portion 42 facing the opening 615 in the first direction D1. Additionally, the coupling terminal 40 is held in the housing space 611 in a state where movement in the first direction D1 is restricted by the holding protrusions 625 and 635 protruding in the second direction D2.

In the housing portion 61, while the coupling terminal 50 is housed in the second recessed portion 67 of the container body 62, the second lid portion 64 is fitted to an opening side of the second recessed portion 67 of the container body 62. As a result, a housing space 612 in which the coupling terminal 50 is housed is formed by the inner side of the second recessed portion 67 and the back surface of the second lid portion 64. At this time, in the coupling terminal 50, the holding protrusions 626 of the container body 62 are inserted into the holding holes 59 of the held portion 53, and the holding protrusions 645 of the second lid portion 64 are inserted into the holding holes 58 of the held portion 53. As a result, the coupling terminal 50 is held in the housing space 612 in the housing portion 61 with the first connection portion 51 facing the opening 614 and the second connection portion 52 facing the opening 616 in the first direction D1. Additionally, the coupling terminal 50 is held in the housing space 612 in a state where movement in the first direction D1 is restricted by the holding protrusions 626 and 645 protruding in the second direction D2.

Then, the housing portion 61 is inserted into the through-hole 23 of the magnetic core 20 from the side where the locking portions 65a and 65b are formed. At this time, the locking portions 65a and 65b that have passed through the through-hole 23 are hooked on the edge portion of the opening 24 of the through-hole 23, and thus the housing portion 61 is locked to the magnetic core 20. That is, the housing portion 61 is reliably held within the through-hole 23 of the magnetic core 20 by the locking portions 65a and 65b. Additionally, the flanges 634 and 644 of the housing portion 61 butt against the edges of the opening 25 of the magnetic core 20, and thus the insertion of the housing portion 61 is restricted.

Next, a procedure for coupling the busbar to the noise filter 10 will be described.

The insertion portion 101c of the busbar 101 is inserted into between the elastic pieces 44 and 45 of the first connection portion 41 from the opening 613 of the housing portion 61, and the insertion portion 102c of the busbar 102 is inserted into between the elastic pieces 46 and 47 of the second connection portion 42 from the opening 615 of the housing portion 61. In this way, the busbar 101 and the busbar 102 are coupled by the coupling terminal 40, which is disposed in the through-hole 23 of the magnetic core 20.

The insertion portion 103c of the busbar 103 is inserted into between the elastic pieces 54 and 55 of the first connection portion 51 from the opening 614 of the housing portion 61, and the insertion portion 102c of the busbar 104 is inserted into between the elastic pieces 56 and 57 of the second connection portion 52 from the opening 616 of the housing portion 61. In this way, the busbar 103 and the busbar 104 are coupled by the coupling terminal 50, which is disposed in the through-hole 23 of the magnetic core 20.

Here, since the insertion portions 101c to 104c of the busbars 101 to 104 are gripped by the first and second connection portions 41 and 42, which are the elastic pieces, the insertion portions 101c to 104c are allowed to move in a direction parallel to the surfaces of the insertion portions 101c to 104c while electrical contact between the coupling terminals 40 and 50 is maintained. Similarly, the busbars 101 to 104 can be moved slightly in association with displacement of the elastic pieces in the direction (that is, the second direction D2) being gripped by the elastic pieces 44 to 47 and 54 to 57 as well. Accordingly, even when slight misalignment occurs between the busbars 101 and 103 on the side gripped by the first connection portions 41 and 51 and the busbars 102 and 104 on the side gripped by the second connection portions 42 and 52, the busbars can be coupled with the misalignment absorbed.

1-3. Effects

In the present embodiment described above, the following effects can be provided.

(1a) The noise filter 10 includes the holding portion 60 that holds the coupling terminals 40 and 50 in the through-hole 23 with the first connection portions 41 and 51 facing the first opening from the inside of the through-hole 23 of the magnetic core 20 and the second connection portions 42 and 52 facing the second opening from the inside of the through-hole 23.

In this way, among the two busbars, the first busbar is connected with the first connection portion 41 exposed from the first opening of the through-hole 23 of the magnetic core 20, and the second busbar can be connected with the second connection portion 42 exposed from the second opening of the through-hole 23. Thus, both busbars can be electrically coupled. Therefore, regardless of the bent shape of the busbar, the signal flowing through the first busbar is passed through the through-hole 23 of the magnetic core 20 to ensure that the signal flows to the second busbar. As a result, the noise filter 10 can be less likely to reduce a noise reduction effect while increasing a degree of freedom in the busbar shape in a device.

(1b) The holding portion 60 of the noise filter 10 includes the housing portion 61 disposed inside the through-hole 23. The coupling terminals 40 and 50 are housed in the housing portion 61 to hold the coupling terminals 40 and 50 to the magnetic core 20.

This allows the coupling terminals to be held in the through-hole while the coupling terminals 40 and 50 maintain insulation properties with the magnetic core 20. Thus, while a signal is appropriately transmitted between the busbars, the noise reduction effect of the noise filter 10 can be less likely to be reduced.

(1c) The holding portion 60 is disposed inside the through-hole 23. The holding portion 60 includes the locking portions 65a and 65b that cause the holding portion 60 to be locked to the magnetic core 20.

This enhances a fixing force of the holding portion 60 with respect to the magnetic core to ensure that the coupling terminals 40 and 50 are reliably positioned in the magnetic core 20. For example, even when an external force is applied to the coupling terminals 40 and 50 via the busbars, it can be suppressed that the coupling terminals 40 and 50 are pulled out of the through-hole 23 of the magnetic core 20, and reduction in noise reduction effect of the noise filter 10 can be suppressed.

1-4. Modifications of First Embodiment (1d) In the first embodiment described above, the coupling terminals 40 and 50 have the holding holes formed in the held portions 43 and 53, and the housing portion 61 has the holding protrusions inserted into the holding holes. Instead of this, the coupling terminals 40 and 50 may have holding protrusions on the held portions 43 and 53, and the housing portion 61 may have holding holes.

(1e) In the first embodiment described above, the holding portion 60 includes the locking portions 65a and 65b. Instead of this, the holding portion 60 need not include the locking portions 65a and 65b. Additionally, the holding portion 60 may include one locking portion instead of including the two locking portions 65a and 65b.

2. Second Embodiment

In the second embodiment, the configuration different from the first embodiment will be mainly described. Note that in the second embodiment, the same reference numerals are assigned to the same portions as those of the first embodiment, and the description thereof will not be repeated.

2-1. Configuration

Figure 12:
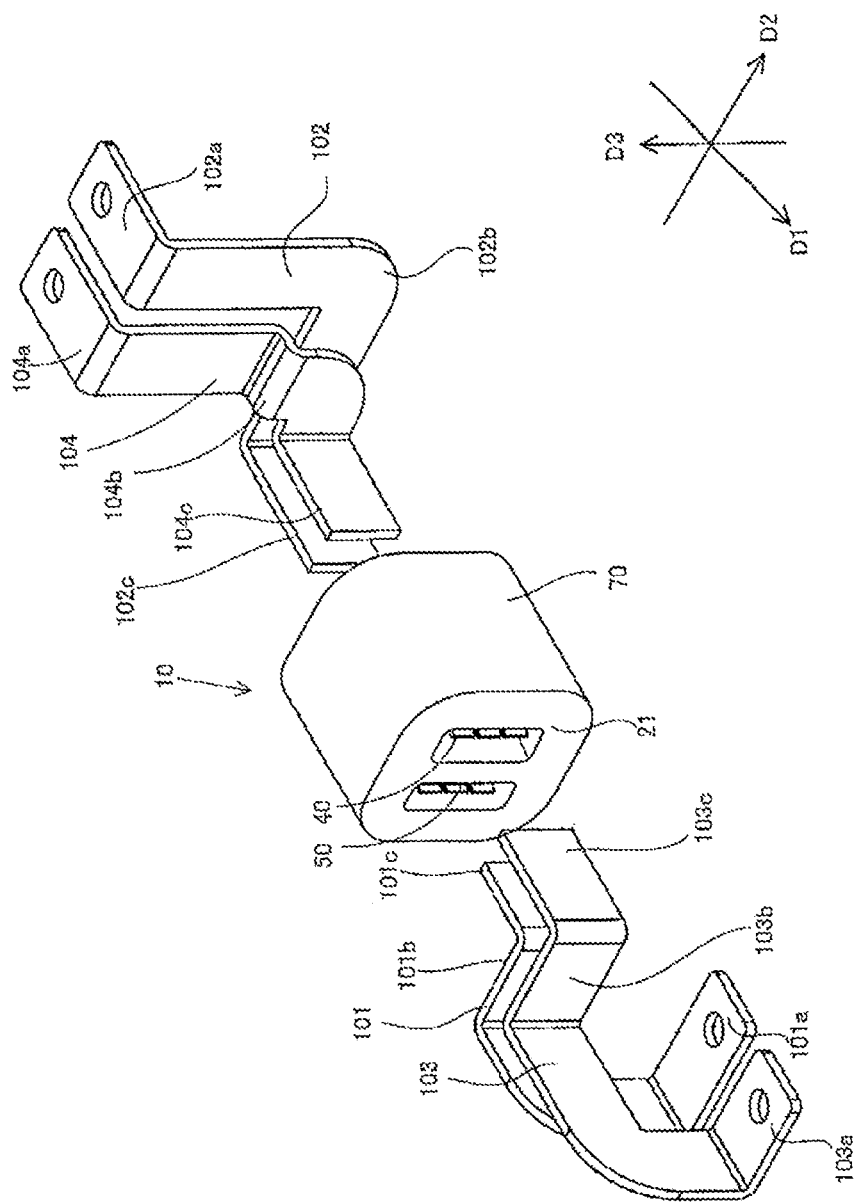
FIG. 12 is a perspective view of a noise filter according to a second embodiment.
Figure 13:
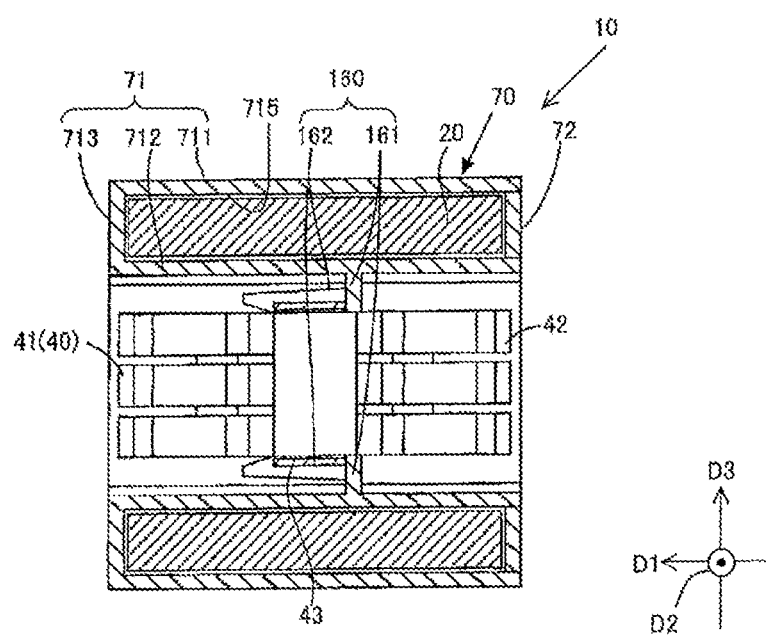
FIG. 13 is a cross-sectional view of the noise filter in a surface parallel to the first direction and the third direction.
Figure 14:
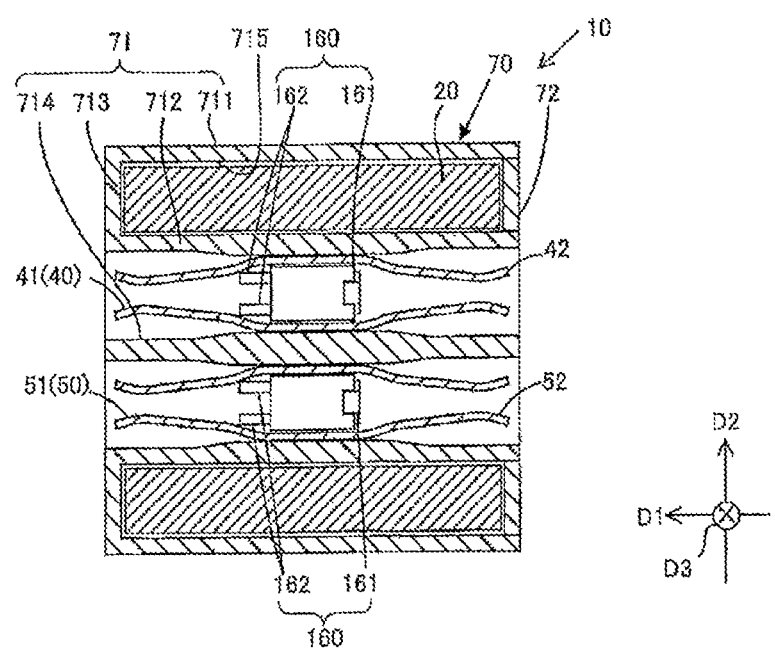
FIG. 14 is a cross-sectional view of the noise filter in the surface parallel to the first direction and the second direction.

In the present embodiment, as illustrated in FIG. 12, the noise filter 10 includes a case 70 that houses the magnetic core 20. Additionally, the holding portion holding the coupling terminal is integrally formed with the case 70. FIG. 13 is a cross-sectional view of the noise filter 10 according to the present embodiment in a surface parallel to the first direction D1. FIG. 14 is a cross-sectional view of the noise filter 10 according to the present embodiment in a surface parallel to the second direction D2.

As illustrated in FIGS. 13 and 14, the case 70 includes a case body 71 and a lid portion 72. The case 70 is made of a non-conductive resin, for example, a polyamide resin that can be used as the material. The case body 71 includes an outer tubular portion 711, a through-tubular portion 712, a bottom portion 713, and a partition wall 714. The outer tubular portion 711 is a tubular portion extending in the first direction D1 from a first surface of the bottom portion 713. An end on the side opposite to the bottom portion 713 of the outer tubular portion 711 is open. The through-tubular portion 712 is a tubular portion that extends in the same direction as the extending direction of the outer tubular portion 711 from the first surface of the bottom portion 713 inside the outer tubular portion 711. Specifically, the outer diameter dimension of the through-tubular portion 712 is smaller than the outer diameter dimension of the outer tubular portion 711. As a result, a housing space 715 housing the magnetic core 20 is formed between an inner peripheral surface of the outer tubular portion 711 and an outer peripheral surface of the through-tubular portion 712.

As illustrated in FIG. 14, the partition wall 714 is a plate-like portion that extends so as to partition the inside of the through-tubular portion 712. As a result, two terminal housing spaces separated by the partition wall 714 are formed inside the through-tubular portion 712.

The lid portion 72 is a ring-shaped member having an opening in the center. The lid portion 72 is attached to the case body 71 so as to cover an opening of the housing space 715 formed between the outer tubular portion 711 and the through-tubular portion 712 at the end on the side opposite to the bottom portion 713 of the case body 71.

Holding portions 160 are integrally formed with the case 70. In the present embodiment, the holding portion 160 is provided in each of the two terminal housing spaces separated by the partition wall 714 inside the through-tubular portion 712. Specifically, the holding portion 160 includes an extending piece 161 and locking pieces 162. The extending piece 161 is a piece-shaped portion extending inward from an inner peripheral surface of the through-tubular portion 712. The locking piece 162 is a portion extending from the extending piece 161 in the first direction D1, and having a distal end with a claw shape. Specifically, the locking piece 162 protrudes from a position on the inner peripheral surface side by a specified dimension in the third direction D3 from a distal end of the extending piece 161. In the holding portion 160 having the configuration described above, the held portions 43 and 53 of the coupling terminals 40 and 50 can be sandwiched between the distal end of the locking piece 162 and the distal end of the extending piece 161.

In the case 70 having the configuration described above, the magnetic core 20 is housed in the housing space 715 in the case 70 with the through-tubular portion 712 passing through the through-hole 23. In each of the two terminal housing spaces defined by the partition wall 714 inside the through-tubular portion 712, the coupling terminal 40 or 50 is housed to be held by the holding portion 160. In the present embodiment as well, the coupling terminals 40 and 50 are held to the magnetic core 20 by the holding portions 160 with the respective connection portions 41, 42, 51, and 52 facing in the first direction D1. In the present embodiment, the through-tubular portion 712 is an example of a through-portion.

2-2. Effects (2a) In the present embodiment described above, the noise filter 10 includes the case 70 housing the magnetic core 20 and made of a non-conductive resin. The case 70 includes the through-tubular portion 712 having the tubular shape. The case 70 houses the magnetic core 20 in a state where the through-tubular portion 712 passes through the through-hole 23 of the magnetic core 20. Each of the coupling terminals 40 and 50 is disposed inside the through-tubular portion 712.

As a result, in the noise filter 10 provided with the case 70 as well, the same effects as those of the first embodiment can be obtained.

(2b) The holding portion 160 is disposed inside the through-hole 23 of the magnetic core 20 and is integrally formed with the case 70.

As a result, in the noise filter provided with the case 70 as well, an increase in the number of components can be suppressed while the same effects as those of the first embodiment are provided.

2-3. Modifications of Second Embodiment (2c) In the second embodiment described above, the holding portion 160 integrally formed with the case 70 includes the extending piece 161 and the locking pieces 162. Instead of this, holding protrusions to be inserted into the holding holes provided in the held portions of the coupling terminals 40 and 50 may be formed as the holding portions 160 on the inner peripheral surface of the through-tubular portion 712 in the case 70. In this case, the coupling terminals 40 and 50 disposed inside the through-tubular portion 712 are held in a state where the holding protrusions included in holding members are inserted into the holding holes formed in the held portions.

(2d) The holding portions 160 hold the coupling terminals 40 and 50 inside the through-hole 23 of the magnetic core 20. Instead of this, the holding portions 160 may be integrally formed with the case 70 and hold the coupling terminals 40 and 50 from the outside of the through-hole 23.

3. Other Embodiments

The technique disclosed in this specification is not limited to the above-described embodiments, can be modified to various configurations without departing from the gist of the present invention, and, for example, can be modified as follows.

(3a) In the respective embodiments described above, the two coupling terminals 40 and 50 are held by the holding portions 60 in the through-hole 23 of the magnetic core 20. Instead of this, one coupling terminal may be held by the holding portion 60 in the through-hole 23 of the magnetic core 20.

(3b) In the respective embodiments described above, the first and second connection portions 41, 42, 51, and 52 of the coupling terminals 40 and 50 are constituted by a pair of the elastic pieces that grip both surfaces of the busbars. The first and second connection portions 41, 42, 51, and 52 only need to hold the insertion portions of the busbars, and are not limited to the pair of elastic pieces described above. For example, the first and second connection portions 41, 42, 51, and 52 may be constituted by insertion grooves that hold the insertion portions of the busbars by inserting the insertion portions of the busbars into the insertion grooves.

The invention claimed is:

1. A noise filter, comprising:
a non-divided type magnetic core in which a through-hole having a first opening and a second opening at respective ends of the through-hole is formed;
a conductive coupling terminal including a first connection portion and a second connection portion at respective ends of the conductive coupling terminal, the first connection portion and the second connection portion being connectable to busbars, the conductive coupling terminal being disposed inside the through-hole; and
a holding portion that holds the conductive coupling terminal disposed inside the through-hole, wherein
the conductive coupling terminal is held to the magnetic core by the holding portion in a state where the first connection portion faces the first opening from inside of the through-hole and the second connection portion faces the second opening from inside of the through-hole.

2. The noise filter according to claim 1, comprising
a case made of a non-conductive resin and housing the magnetic core, wherein
the case includes a through-portion having a tubular shape, and the case houses the magnetic core in a state where the through-portion passes through the through-hole, and
the conductive coupling terminal is disposed inside the through-portion.

3. The noise filter according to claim 1, wherein
the holding portion includes a housing portion disposed inside the through-hole, and the housing portion houses the conductive coupling terminal to hold the coupling terminal disposed inside the through-hole.

4. The noise filter according to claim 1, wherein
the holding portion includes a locking portion, and the locking portion is disposed inside the through-hole to lock the holding portion to the magnetic core.

5. The noise filter according to claim 2, comprising
wherein
the holding portion is disposed inside the through-hole and integrally formed with the case.

6. The noise filter according to claim 3, comprising
a case made of a non-conductive resin and housing the magnetic core, wherein
the holding portion is disposed inside the through-hole and integrally formed with the case.

* * * * *